United States Patent [19]

Schierz

[11] Patent Number: 4,734,755

[45] Date of Patent: Mar. 29, 1988

[54] ALTERNATING LOAD STABLE SWITCHABLE SEMICONDUCTOR DEVICE

[75] Inventor: Winfried Schierz, Heideck, Fed. Rep. of Germany

[73] Assignee: Semikron Gesellschaft für Gleichrichterbau, Nuremberg, Fed. Rep. of Germany

[21] Appl. No.: 742,621

[22] Filed: Jun. 7, 1985

[30] Foreign Application Priority Data

Jun. 9, 1984 [DE] Fed. Rep. of Germany ....... 3421672

[51] Int. Cl.⁴ ..................... H01L 23/00; H01L 23/28
[52] U.S. Cl. ........................................ 357/74; 357/71; 357/72; 357/79; 174/52 P
[58] Field of Search ............... 357/74, 71, 79, 72; 174/52 P

[56] References Cited

U.S. PATENT DOCUMENTS

| 2,863,105 | 12/1958 | Ross | 357/71 |
| 3,221,219 | 11/1965 | Emeis et al. | 357/71 |
| 3,265,805 | 8/1966 | Carlan et al. | 357/79 |
| 3,293,509 | 12/1966 | Emeis | 357/79 |
| 3,599,057 | 8/1971 | Lootens | 357/79 |
| 3,721,867 | 3/1973 | Schierz | 174/52 P |
| 3,823,350 | 7/1974 | Stoner | 357/79 |
| 3,992,717 | 11/1976 | Rice | 174/52 P |
| 4,399,452 | 8/1983 | Nakashima et al. | 357/72 |
| 4,587,550 | 5/1986 | Matsuda | 357/79 |
| 4,607,275 | 8/1986 | Vogt et al. | 357/79 |

FOREIGN PATENT DOCUMENTS

| 2704914 | 8/1978 | Fed. Rep. of Germany | 357/71 |
| 2719400 | 11/1978 | Fed. Rep. of Germany | 357/79 |
| 3006023 | 2/1980 | Fed. Rep. of Germany | 357/79 |
| 3009511 | 9/1980 | Fed. Rep. of Germany | 357/79 |
| 3308661 | 9/1984 | Fed. Rep. of Germany | 357/79 |
| 1066148 | 6/1981 | France | 357/74 |
| 55-59744 | 5/1980 | Japan | 357/79 |
| 55-134941 | 10/1980 | Japan | 357/79 |
| 56-126952 | 10/1981 | Japan | 357/74 |
| 60-760 | 1/1985 | Japan | 357/72 |
| 0277111 | 7/1970 | U.S.S.R. | 357/79 |

Primary Examiner—Martin H. Edlow
Assistant Examiner—Jerome Jackson
Attorney, Agent, or Firm—Horst M. Kasper

[57] ABSTRACT

A semiconductor device element, switchable and stable against alternating loads, is provided as an intermediate product which can be stored, can be applied universally, has a semiconductor wafer disposed between two annular insulating bodies and is stabilized on its surface. The semiconductor wafer is connected on two sides via soldering to a contact piece of molybdenum. The contact pieces are provided on their outer surface in each case with a metallization for providing pressure contacting. The semiconductor wafer is covered with a protecting, that is, passivating and stabilizing, covering in the edge zone up to the jacket face of the contact pieces. The edge zone of the semiconductor is immersed in an additional surface stabilizing material in the edge zone between the insulating bodies. The adhesive properties of the surface stabilizing substance mutually connect the insulating bodies and the semiconductor wafer. The contact pieces and the insulating bodies form a sealed enclosure of the semiconductor wafer, and the control electrode of the semiconductor is pressure contacted by a control current conductor held in one of the insulating bodies, which control electrode is formed as a leaf spring.

22 Claims, 4 Drawing Figures

ALTERNATING LOAD STABLE SWITCHABLE SEMICONDUCTOR DEVICE

BACKGROUND OF THE INVENTION

1. Field of the Invention

The invention relates to an alternating load stable, switchable semiconductor element where the pretreated edge zone of the semiconductor wafer is disposed between two annular insulating bodies and covered with a surface stabilizing material and where the current conductor for the control electrode of the semiconductor wafer is led through one of the insulating bodies.

2. Brief Description of the Background of the Invention Including Prior Art

Semiconductor devices with high loadability of current are subjected to an extreme loading by push, thrust and shearing forces upon use under alternating load due to the generated extreme loading corresponding to the change in the operating temperature and in particular at the connection surfaces of adjoining materials with different thermal expansion coefficients. Soft solder contacts, as they are employed between the semiconducting material and the adjoining contact pieces in semiconductor device elements of small power and for constant load, are not stable because of the resulting embrittling of the contact surfaces, the so-called contact aging, caused by the extreme loading. In addition, steps for improving such tin solder materials have not in all cases produced the desired alternating load stability of the soldering contacts.

It is known to employ hard solder junctions in the case of semiconductor rectifier elements for such an extreme loading. The high cost of the process and the frequently observed interference with the properties of the semiconductor materials due to the high processing temperatures are particular disadvantages of such constructions.

A solution of the problem was achieved with the so-called pressure contacting. The advantages of this technique as compared to the soldering contact method are that no contact aging occurs, that under certain conditions mechanical tensions are balanced by sliding of adjoining materials, that the contact layers can be tested in a destruction free manner and that the expense of the process is substantially less.

In comparison, soldering contacts exhibit the advantage of lower thermal resistance and thus better thermal and also electrical operating behavior as well as a higher loadability with peak currents. In particular, these properties have substantial importance in the operation of semiconductor devices subject to alternating loads.

Presently, semiconductor devices in addition are employed in the shape of discrete individual elements as semiconductor construction units in compact construction with at least two electrically switched elements, that is, in so-called power modules, for loading with alternating power loads. These power modules are associated with the advantage of favorable cost of the construction and are associated with a simple electrical contacting of the device parts. For economic reasons, the exchangeability of the semiconductor device elements and of their contact construction components is desired at all steps of the assembling. This forces the provision of pressure contacting of the device elements.

Power modules are known where the semiconductor device elements are in fact pressure contacted, however they are embedded in a cast resin including a section of the joining contact components. This construction renders ineffective the advantages of pressure contacting.

According to other modular constructions, the semiconductor device elements are formed by stacking of contact and envelope bodies with the semiconductor wafer as well as by employing sealing materials. These constructions do not exhibit in all cases the desired long-term stability.

Finally, power modules are known which included discrete, disk-shaped semiconductor devices based on a substantially more costly construction.

It is common to the known semiconductor devices and construction units that their semiconductor device elements or parts of them are employable only in the specific construction form based on their specific design or the construction form desired in each case. The limited possibilities of application of such semiconductor device elements in addition require an expensive maintenance of storage of device components.

SUMMARY OF THE INVENTION

1. Purposes of the Invention

It is an object of the present invention to provide a semiconductor device element of high current loadability under alternating voltage conditions.

It is another object of the present invention to provide a semiconductor device element employing a pressure contact construction which exhibits a lower thermal resistance as compared to conventional constructions.

It is yet another object of the present invention to provide a semiconductor device which is formed for a universal employment in different constructions and which furnishes the desired treatment-independent long-term stability.

These and other objects and advantages of the present invention will become evident from the description which follows.

2. Brief Description of the Invention

The present invention provides a semiconductor device comprising a semiconductor wafer with a first contact piece attached to one of its main current faces and a second contact piece attached to one of its main current faces such that the semiconductor wafer together with the contact pieces form a stack. A metallic coating suitable for pressure contacting covers a free contact face of a respective contact piece, and a supportive covering covers the free remaining surface sections of the stack. Insulating bodies surround the stack. The edge zone of the semiconducting wafer disposed between the insulating bodies is submerged into a material providing adhesive effects on surrounding materials, and the material providing adhesive effects is associated with the insulating bodies such that the insulating bodies adjoining the contact pieces and the stack form a dense enveloping of the semiconductor wafer. A control current conductor has a section running through one of the insulating bodies and the control current conductor is solidly and sealingly enclosed.

The two contact pieces can be of the same dimensions and can be formed of a material which exhibits a thermal expansion coefficient adapted to that of the semiconductor material. The two contact pieces can be attached to the semiconductor wafer by soldering and can be provided with a metallization favoring soldering at their soldering contact surface, or the two contact pieces can be attached to the semiconductor wafer by alloying. The two contact pieces can be provided in each case with a noble metal coating or a metallic nickel coating at the surface to be pressure contacted.

The semiconductor wafer can be provided with a free edge strip on each side between the main current surface and the jacket surface for a coordinated and guided placement of the insulating body.

A rubber adhesive material can be employed as a surface stabilizing material.

The annular insulating bodies can be substantially formed as cylinders and can be provided with a protrusion in each case at their front face disposed toward the semiconductor wafer, with which they can form a clamp-shaped support for the semiconductor wafer.

The annular insulating bodies can be provided at their inner jacket surface with a shoulder-shaped thicker section adapted to allow the reception of additional contact device structures.

One of the annular insulating bodies can be provided with a shell-like extension of its outer jacket surface with a hook shaped end, where a solid and rigid connection can be provided for the insulating bodies by snapping the hook-shaped end into a corresponding recess of the outer jacket surface of the other insulating body.

The control current conductor can be made of a spring material, formed as a leaf spring and disposed in a recess of the corresponding contact piece such that the control electrode of the semiconductor wafer is contacted by spring pressure.

The section of the control current conductor running through the one of the insulating bodies can be flattened, expanded and roughened.

The soldering material for attaching the contact pieces can be a lead solder comprising about 2.5 to 5 weight percent tin, 2.5 to 5 weight percent silver with the remainder being essentially lead. Alternatively, the soldering material can be a nearly eutectic tin silver alloy.

A covering of the free and otherwise exposed surface sections of the stack can be provided by including a material which is a member of the group consisting of glass, polyimide, silicone lacquer and mixtures thereof.

The annular insulating body can be made of a plastic material.

The semiconductor wafer can exhibit a thyristor structure or a transistor structure.

Another aspect of the present invention provides a method for producing a semiconductor device comprising the following steps: Contact pieces are soldered to a semiconductor wafer with lead solder for forming a stack. Insulating bodies are placed on a edge strip of the semiconductor wafer. A covering is placed onto the free semiconductor surfaces by screen printing to provide a protecting, passivating and stabilizing effect. Silicone resin is applied in the region of the semiconductor edge zone in an amount sufficient to fill the intermediate space between the insulating body and the semiconductor wafer upon successive placing of the insulating bodies. The device is heated to polymerize the silicone resin to form a solid mutual connection of insulating body and semiconductor wafer.

Investigations have surprisingly given the result that ductile soft solder junctions of the semiconductor wafer are also stable when subjected to alternating loads in the case of a semiconductor device with pressure contact construction.

According to a construction of the invention, advantageously all characteristic parameters can be measured in a simple way. It represents a storagable, particularly cost advantageous intermediate product which can be incorporated and built into devices for one or several semiconductor device elements in a surprisingly simple electrical and spatially selectable way. A semiconductor device element is known from German Pat. No. DE-PS 2,704,914, where the semiconductor wafer is contacted on its anode by soldering or alloying and on the side of the cathode by pressure in each case with a contact electrode of molybdenum. Suggestions with regard to ductile soft solder compounds as well as steps for a structure for the universal application however, are not indicated in the known state of the art. Furthermore, the German Pat. No. DE-PS 3,009,511 teaches a construction where the semiconductor wafer is alloyed on its anode side with a round tungsten blank and on the cathode side with a round molybdenum blank and where the contact round blanks are joined by soldering with connection conductors of copper. Finally, an electrically testable, particularly economic and long-term storage adapted construction has been proposed favoring a simple mounting. This construction can be employed as desired in conventional disk cells or in construction units with two or more device elements as desired. Here, a semiconductor wafer and an insulating body annularly surrounding the wafer form a semiconductor device element. The insulating body is provided at its inner jacket surface with a recess adapted to the edge zone of the semiconductor wafer. In addition, suitable forms for concentric disposition of contact construction elements to the semiconductor wafer are provided at this recess. This semiconductor wafer is then to be enclosed at its edge zone in the recess and is to be supported there. However, such a construction does not allow the solution of the problem posed in the instant application.

The novel features which are considered as characteristic for the invention are set forth in the appended claims. The invention itself, however, both as to its construction and its method of operation, together with additional objects and advantages thereof, will be best understood from the following description of specific embodiments when read in connection with the accompanying drawing.

BRIEF DESCRIPTION OF THE DRAWING

In the accompanying drawing, in which are shown several of the various possible embodiments of the present invention.

The same parts are designated with the same reference numerals in all Figures.

DESCRIPTION OF INVENTION AND PREFERRED EMBODIMENT

Figure 1:
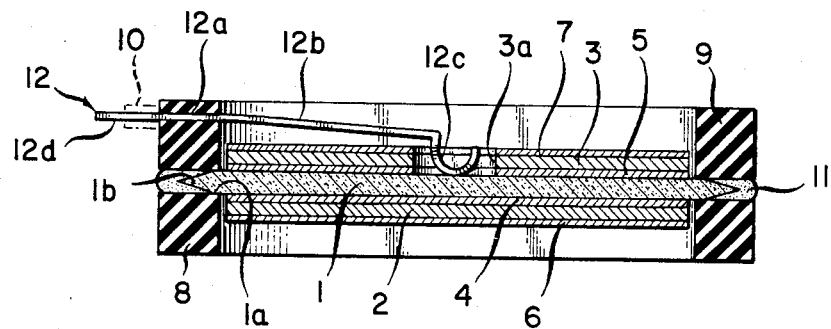
FIG. 1 is a cross section through a center plane of the construction of the semiconductor device element.

In accordance with the present invention, there is provided a semiconductor device element which can be switched and which is stable under changing loads, where a pre-treated edge zone of the semiconductor wafer is disposed between two annualr insulating bodies and is covered with a surface stabilizing material. The current conductor for the control electrode of the semiconductor disk is guided through an insulating body.

A stack I is formed from a semiconductor wafer 1 and contact pieces 2, 3, of which one of each is attached at the two main current surfaces of the semiconductor wafer. The pre-contact surface of the contact pieces 2, 3 is provided in each case with a metallic coating 6, 7 adapted for pressure contacting. The remaining free surface sections of the stack I are covered with a protective covering 35. The edge zone 1b disposed between the insulating bodies 8, 9 is submerged in a substance 11 which is provided with adhesive action versus the adjoining materials and which thereby is also connected to the insulating bodies. A sealed envelope of the semiconductor wafer is formed from the insulating bodies 8, 9 and the stack I, where the insulating bodies adjoin the contact pieces 2, 3 at the semiconductor wafer 1. The section 12a of the control current conductor 12 running through the one insulating body 9 is solidly and fixably enclosed forming a seal.

The contact pieces 2, 3 can have the same dimensions and can comprise a material which is adapted to the thermal expansion coefficient of the semiconductor material.

Preferably, the thermal expansion coefficient at the respective temperatures of the semiconductor material and of the contact pieces does not differ by more than 50% and preferably by less than 20%.

The contact pieces 2, 3 can be attached to the semiconductor wafer 1 by soldering. The contact pieces 2, 3 can in each case be provided at their soldering contact surface with a metallization favoring soldering. The metallization can comprise noble metals such as silver and group VIII metals such as nickel. Noble metals are preferred in this context.

The contact pieces 2, 3 can be attached to the semiconductor wafer 1 by alloying.

The contact pieces 2, 3 can in each case exhibit a noble metal covering 6, 7 at the surface intended for the pressure contacting.

The contact pieces 2, 3, can in each case be provided with a metallic coating of nickel at the surface intended for pressure contacting.

The semiconductor wafer 1 can be provided with a free edge strip 1a corresponding to the edge zone 1b on each side between the main current surface and the edge zone 1b corresponding to the jacket surface for a guided and controlled placement of the insulating body 18, 19 in each case. A caoutchouc adhesive mass or a rubber adhesive mass can be employed as surface stabilizing substance 11 with adhesive action.

Annular insulating bodies 18, 19 are formed substantially in the shape of a cylinder and they are provided in each case with a protrusion 18a, 19a at their front face disposed toward the semiconductor wafer 1 and the protrusion can form a clamp-like support for the semiconductor wafer. The annular insulating bodies 28, 29 can be provided at their inner jacket surface with a shoulder-shaped thickening 28a, 29a for providing an aligned reception of further contact building parts.

One of the annular insulating bodies 29 can be provided with a hook-shaped end 29d as an extension of a shell-like protrusion 29c of its outer jacket surface and, by snapping of the extension into a corresponding recess 28b of the outer jacket surface of the other insulating body 28, there is generated and provided a solid connection of the insulating bodies.

The control current conductor 12 can be produced from a spring material which is formed as leaf spring 12b, 12c and which is disposed in a recess 3a of the corresponding contact piece 3 such that the control electrode of the semiconductor wafer is contacted with the spring pressure. The section 12a of the control current conductor 12 running through an insulating body 9 is preferably flattened, expanded and roughened.

The soldering metal for attaching the contact pieces 2, 3 can be provided as a lead solder 2.5 to 5 weight percent tin, 2.5 to 5 weight percent silver and where the remainder is substantially lead. Preferably the soldering material is a eutectic tin-silver tinning alloy. The distance from the eutectic point of the melt diagram tin-silver alloy should not be further than a composition corresponding to 30 degrees centigrade difference from the eutectic point. Known surface protection coverings for semiconductor surfaces such as glass, polyimide or silicone lacquer can be provided as a protective covering of the free and exposed surface section of the stack I.

The annular insulating body 8, 9; 18, 19; 28, 29 can be provided from a plastic material such as, for example, Polysulfon.

The semiconductor wafer can comprise a thyristor structure. Alternatingly, the semiconductor wafer can exhibit a transistor-like structure.

According to an embodiment of the invention shown in FIG. 1, there is a semiconductor wafer 1 connected on its anode side via a soldering contact layer 4 and on the cathode side via a corresponding soldering contact layer 5 in each case in a solid way to a contact piece 2 or, respectively, 3. The thickness of the soldering layer can be from about 1/50 to 1/5 of the thickness of the semiconductor wafer. The diameter of the contact piece can be from about 0.5 to 0.9 of the diameter of the semiconductor wafer. The semiconductor wafer 1 can be provided with the structure of a thyristor and the control electrode not shown is disposed in the center region of the cathode side. The corresponding contact piece 3 is provided with a central open area 3a for positioning the control current conductor 12.

The contact pieces preferably have the same dimensions in order to avoid warping by bimetal effects during heating, and they comprise a metal, for example molybdenum, with a thermal expansion coefficient which corresponds to that of the semiconductor material. The thermal expansion coefficient of the semiconductor material and of the contact piece should not differ by more than 20% and preferably not more than 10% in the area under consideration.

The contact pieces further are blank at their jacket faces in order to avoid the formation of soldering bridges during soldering. The solder contact surfaces can be provided with a metallization for example made of silver, which is not specifically shown in the drawing.

According to the invention, the soldering contact layers 4, 5 comprise preferably lead alloys with 2.5% silver, the balance lead; 2.5% silver, 1.5% indium, the balance lead; 2.5% silver, 2.5% tin, the balance lead or 1.5% silver, 1.5% tin, the balance lead. In addition, a tin-silver solder with a eutectic composition is suitable. Preferably, the soldering materials are soft tin solder material with a particularly high thermal stability. They preferably contain from about 1.5 to 4% silver, from about 0 to 1.5% indium and from about 0 to 4% tin with the remainder being lead. The materials added should not exceed a total of about 6% with the remainder being lead. In addition, a tin-silver solder with about eutectic composition is also suitable, where preferably the composition does not vary by more than 5% from the eutectic composition.

The contact pieces 2, 3 are provided with a metallic coating 6, 7 made of a noble metal or a group VIII metal such as, for example, rhodium, palladium or nickel, for providing a suitable surface for pressure contacting on the side remote from the semiconductor wafer.

This two-sided soft solder connection of the semiconductor wafer in combination with a construction suitable for pressure contacting of a resulting sandwich meets in a particularly advantageous economic way the requirement for a construction stable to alternating load with improved thermal operating behavior.

The contact pieces 2, 3 can also be attached to the semiconductor wafer by alloying.

Figure 2:
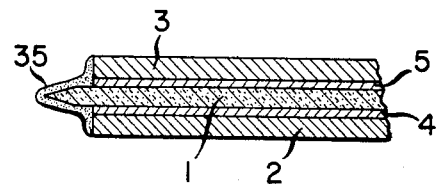
FIG. 2 is a schematic cross sectional view of a stack formed by a semiconductor wafer with a contact piece on each sides.

The stack I formed by the semiconductor 1 and the contact pieces 2, 3 is providing with a passivating and stabilizing covering as shown in FIG. 2 for the protection of the semiconductor surface at the remaining free surface sections of the three construction components, that is, at the edge zone of the semiconductor wafer and at the jacket faces of the contact pieces. This covering can comprise for example glass, a surface protecting lacquer or an organic compound such as preferably polyimide.

This testable and further processable stack I is disposed in an intermediate space formed between two coaxially adjoining annular shaped insulating bodies for achieving an intermediate product which is suitable to be stored, to be processed as desired and to be applied universally, and it is provided at its periphery with a pretreated edge zone 1b of the semiconductor wafer 1. This is achieved by setting in each case a substantially cylinder-shaped insulating body 8 or, respectively, 9 with at least a part of its front face immediately joining at the corresponding contact piece of the edge region of the semiconductor wafer 1. The wafer edge zone 1b protrudes then in the intermediate space which is filled with an additional passivating and stabilizing substance 11. The surface protected wafer edge zone 1b dips fully into the substance 11 which exhibits additional adhesive properties versus the material of the protective coating 35 and the insulating body 8, 9 and which serves to provide a mutual solid connection.

The semiconductor wafer is on both sides and over the course of its edge zone sealingly enclosed and also mechanically protected by the stack I and the insulating bodies 8, 9. Silicone caoutchouc with adhesive properties, for example, a material sold under the trademark HYPEC of the Dow-Corning Corporation, is suitable as the surface stabilizing material 11.

The shape of the edge zone of the wafer can be as desired. It is represented in the drawing in each case with a contour with a double negative angle.

One of the annular insulating bodies 8 serves as a support for the control current conductor 12. This control current conductor comprises a spring material and is formed as leaf spring. The first section 12a is flattened for a tight seal and enclosure in the insulating body 8 and is provided with a heavy roughened surface. The adjoining section 12b is provided inclined against the contact piece 3. The arc-shaped end 12c is pressing against the control electrode due to the pressure of the spring material. The end piece is arc-shaped and due to this form and this material, the contact pressure resulting gives a tension loading of the adhesive connection of the insulating body 8, 9, which is to be considered in selecting the material 11.

The insulating body 8 can be provided at its outer jacket face with a protrusion 10 for receiving and enveloping a larger section 12a of the control current conductor 12 in order to extend the creeping leakage distance. The protrusion 10 can have a length which corresponds to from about 0.3 to the full thickness of the insulating body in radial direction. The section 12a of the control current conductor 12 can be applied solidly and sealingly by injection molding or by molding at the insulating body 8.

In order to achieve an intended relative disposition of the insulating body 18, 19 desired in each case, in addition a free edge strip 1a can be provided between the main current face and an inclined edge zone or, respectively, jacket face on each side of the semiconductor wafer 1. This can also be recognized in FIG. 1.

Figure 3:
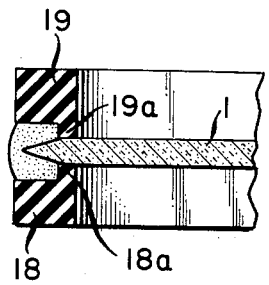
FIG. 3 is a cross sectional view of another embodiment of the insulating body.

In order to achieve such an intended attachment of the insulating body according to a further development of the invention, each of the cylinder shaped insulating bodies can be provided with a protrusion 18a, 19a according to the representation in FIG. 3, at its corresponding front face, with which protrusion the insulating body can be set on the respective edge strip 1a of the semiconductor wafer and a clamping shaped support of the semiconductor wafer can be formed. In addition, an expanded intermediate space can be achieved for optimum embedding of the wafer edge zone in the material 11 according to this feature.

Figure 4:
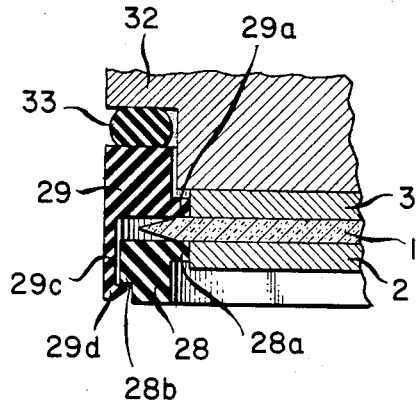
FIG. 4 is a cross sectional view of a further embodiment of the insulating body in a joint construction with a semiconductor wafer and contact device parts.

A further advantageous embodiment of the invention is illustrated in FIG. 4. The insulating bodies 28, 29 are furnished at the inner jacket face adjoining the inner front face in each case with a shoulder-shaped reinforcement 28a, 29a which is closed in itself in each case. The height of the reinforcement is preferably lower, for example from 30 to 80% of the construction height for the contact pieces 2, 3, and the reinforcement makes it easier to place a further construction 32 providing for a pressure contacting of the sandwich. The construction part 32 assures the sealed enclosure in the case of a pressure contacted device via a sealing ring 33.

The insulating bodies are formed corresponding to a mutual attachment by a snap-in means. For this purpose, the upper insulating body 29 is provided with a prolongation of its outer jacket face by a shell-shaped hasp 29c and the sawtoothed-shaped end 29d of the hasp is snapped into an adapted recess 28b of the lower insulating body 28. The length of the hasp can be from about ¼ of the total length of the insulating piece 29 to such a length as would correspond to a match of its end with the lower support surface of the device. The two insulating bodies can be dimensioned such that the elasticity of the material itself can be employed. On the other hand, an extension of the outer jacket space of the one insulating body can be provided not only in the shape of a single shell but shaped as a larger number of web or bracket shaped prolongations which upon setting of the upper insulating body onto the lower insulating body spread apart and allow a longer distance of the end 29d for engaging into the recess 28b.

The height of the construction of the insulating bodies is determined by the desired application as in disk-shaped semiconductor constructions with standardized heights as well as in device constructions with several construction elements with different casing dimensions.

Materials for the insulating bodies which are particularly suitable are molding or injection molding compounds which are stable against creeping currents, preferably materials with a glass fiber filling such as, for example, polyphenylene sulfide plastic used for coatings and molded parts and sold under the trademark RYTON or a material sold under the trademark POLYSULFON.

In order to produce the subject matter of the invention, according to a first step of the procedure, there is formed the stack I by soldering of the contact pieces 2, 3 to the semiconductor wafer with lead solder and with the aid of adjustment and masking steps. In the case of a corresponding dimensioning of the construction components there is provided simultaneously the intended edge strip 1a of the semiconductor wafer 1 for guided placing of the insulating body 8, 9. Then the free semiconductor surface is provided advantageously by screen printing with the protecting, passivating and stabilizing covering 35 placed onto the semiconductor material. The covering can be of a organic compound, that is, a polyimide is particularly advantageous for this application. Then a silicone resin 11 is applied in such an amount in the region of the semiconductor edge zone 1b that in case of a subsequent placing of the insulating bodies 8, 9, the intermediate space formed by these insulating bodies 8, 9 and the semiconductor wafer 1 is filled with the substance 11 and the edge zone 1b is fully immersed into the substance 11. Under these conditions, the front faces of the insulating bodies are also covered with the material 11. Upon a corresponding heating, the silicone resin 11 polymerizes and thus forms a solid mutual connection of the insulating bodies and the semiconductor wafer. At the same time, the disposition of the insulating bodies also provides the casing inner end of the control current conductor on the semiconductor wafer. The width of the sealing ring 33 can be from about ½ the thickness of the insulating body to up to the thickness of the insulating body.

It will be understood that each of the elements described above, or two or more together, may also find a useful application in other types of semiconductor devices differing from the types described above.

While the invention has been illustrated and described as embodied in the context of an alternating load stable, switchable semiconductor device, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A semiconductor device element where a prepared edge of the semiconductor wafer is disposed between two annular insulating bodies comprising
   a semiconductor wafer;
   a first contact piece attached to one of the main current faces of the semiconductor wafer;
   a second contact piece attached to one of the main current faces of the semiconductor wafer such that the semiconductor wafer together with the contact pieces form a stack;
   a metallic coating suitable for pressure contacting and covering a free contact face of a respective contact piece;
   a supportive covering covering the free remaining surface sections of the stack;
   insulating bodies surrounding the stack;
   a material providing adhesive effects on surrounding materials, into which material the edge zone of the semiconducting wafer disposed between the insulating bodies is submerged and whereby the material providing adhesive effects is associated with the insulating bodies and whereby the insulating bodies which are adjoining the contact pieces and the stack form a dense enveloping of the semiconductor wafer;
   a control current conductor having a section running through one of the insulating bodies, which conductor is solidly and sealingly enclosed.

2. The semiconductor device element according to claim 1 where the two contact pieces are of the same dimensions and where the contact pieces are formed of a material which exhibits a thermal expansion coefficient adapted to that of the semiconductor material.

3. The semiconductor device element according to claim 1, where the two contact pieces are attached to the semiconductor wafer by soldering.

4. The semiconductor device element according to claim 1 where the two contact pieces are provided with a metallization favoring soldering at their soldering contact surface.

5. The semiconductor device element according to claim 1 where the two contact pieces are attached to the semiconductor wafer by alloying.

6. The semiconductor device element according to claim 1 where the two contact pieces are provided in each case with a noble metal coating at the surface to be pressure contacted.

7. The semiconductor device element according to claim 1 where the two contact pieces are provided with a metallic nickel coating in each case at the surface provided for pressure contacting.

8. The semiconductor device element according to claim 1 where the semiconductor wafer in each case is provided with a free edge strip on each side between the main current surface and the jacket surface for a coordinated and guided placement of the insulating body in each case.

9. The semiconductor device element according to claim 1 where a rubber adhesive material is employed as a surface stabilizing material.

10. The semiconductor device element according to claim 1 wherein the annular insulating bodies are substantially formed as cylinders and are provided with a protrusion in each case at their front face disposed toward the semiconductor wafer, with which they form a clamp shaped support for the semiconductor wafer.

11. The semiconductor device element according to claim 1 wherein the annular insulating bodies are provided with an inner jacket surface having a shoulder shaped thicker section adapted for allowing the receiving of additional contact device structures.

12. The semiconductor device element according to claim 1 wherein one of the annular insulating bodies has an outer jacket and is provided with a shell-like extension of its outer jacket surface with a hook shaped end, and where a solid and rigid connection is provided for the insulating bodies by snapping in of the hook-shaped end into a corresponding recess of an outer jacket surface of the other insulating body.

13. The semiconductor device element according to claim 1 wherein the control current conductor is made of a spring material, which is formed as a leaf spring and which is disposed in a recess of the corresponding contact piece such that the control electrode of the semiconductor wafer is contacted by spring pressure.

14. The semiconductor device element according to claim 1 wherein the section of the control current conductor running through the one of the insulating bodies is flattened, expanded and roughened.

15. The semiconductor device element according to claim 1 further comprising a soldering material for attaching the contact pieces, which soldering material is a lead solder comprising about 2.5 to 5 weight percent tin, 2.5 to 5 weight percent silver and where the remainder is essentially lead.

16. The semiconductor device element according to claim 1 further comprising a soldering material for attaching the contact pieces which soldering material is a nearly eutectic tin silver alloy.

17. The semiconductor device element according to claim 1 wherein a covering of the free and otherwise exposed surface sections of the stack includes a material which is a member of the group consisting of glass, polyimide, silicone lacquer and mixtures thereof.

18. The semiconductor device element according to claim 1 wherein one of the annular insulating bodies is made of a plastic material.

19. The semiconductor device element according to claim 1 wherein the semiconductor wafer exhibits a thyristor structure.

20. The semiconductor device element according to claim 1 wherein the semiconductor wafer exhibits a transistor structure.

21. The semiconductor device element according to claim 1 wherein one of the annular insulating bodies is made of a member of the group consisting of molding compounds stable against creeping currents, injection molding compounds stable against creeping currents, polyphenylene sulphide plastic, RYTON, POLYSULFON and composites thereof.

22. The semiconductor device element according to claim 21 wherein one of the annular insulating bodies is made of a material containing glass fiber.

* * * * *